United States Patent
Han et al.

(10) Patent No.: US 7,853,940 B1
(45) Date of Patent: Dec. 14, 2010

(54) CREATING A REFERENCE USING TRACKING DATA

(75) Inventors: Zhonglin Han, Acton, MA (US); Amit Mandloi, Acton, MA (US); Austin O'Malley, Acton, MA (US)

(73) Assignee: Dassault Systemes SolidWorks Corporation, Concord, MA (US)

( * ) Notice: Subject to any disclaimer, the term of this patent is extended or adjusted under 35 U.S.C. 154(b) by 1280 days.

(21) Appl. No.: 11/344,457

(22) Filed: Jan. 30, 2006

(51) Int. Cl.
*G06F 9/44* (2006.01)
*G06F 17/50* (2006.01)
(52) U.S. Cl. .............. 717/159; 717/104; 717/120; 703/1; 345/631
(58) Field of Classification Search .............. None
See application file for complete search history.

(56) References Cited

U.S. PATENT DOCUMENTS

| | | | | |
|---|---|---|---|---|
| 5,742,288 A | * | 4/1998 | Nishizaka et al. ........... 345/418 |
| 5,844,563 A | * | 12/1998 | Harada et al. ............... 345/420 |
| 6,898,560 B1 | * | 5/2005 | Das ............................... 703/7 |
| 7,103,516 B2 | * | 9/2006 | Deguchi ....................... 703/2 |
| 7,490,301 B2 | * | 2/2009 | Fujieda ...................... 715/853 |
| 2004/0250236 A1 | * | 12/2004 | O'Malley et al. ........... 717/104 |

\* cited by examiner

*Primary Examiner*—Michael J Yigdall
(74) *Attorney, Agent, or Firm*—Hamilton, Brook, Smith & Reynolds, P.C.

(57) ABSTRACT

Creating a reference to data used to construct a computer-aided design model includes storing model data with tracking data, where the tracking data identifies the model data. A reference is created and the tracking data is associated with the reference to enable the reference to refer to the model data. A modeling operation is executed, which retrieves the tracking data associated with the reference, traverses a data structure defining the computer-aided design model while attempting to match the tracking data associated with the reference to the tracking data stored with the model data, and returns geometric data stored in the model data.

30 Claims, 8 Drawing Sheets

CREATING A REFERENCE USING TRACKING DATA

BACKGROUND OF THE INVENTION

Computer-aided design (CAD) software allows a user to construct and manipulate complex three-dimensional (3D) models. A number of different modeling techniques can be used to create a 3D model. These techniques include solid modeling, wire-frame modeling, and surface modeling. Solid modeling techniques provide for topological 3D models, where the 3D model is a collection of interconnected topological entities (e.g., vertices, edges, and faces). The topological entities have corresponding supporting geometrical entities (e.g., points, trimmed curves, and trimmed surfaces). The trimmed surfaces correspond to the topological faces bounded by the edges. Wire-frame modeling techniques, on the other hand, can be used to represent a model as a collection of simple 3D lines, whereas surface modeling can be used to represent a model as a collection of exterior surfaces. CAD systems may combine these and other modeling techniques, such as parametric modeling techniques. Parametric modeling techniques can be used to define various parameters for different features and components of a model, and to define relationships between those features and components based on relationships between the various parameters.

CAD systems may also support two-dimensional (2D) objects, which are 2D representations of 3D objects. Two- and three-dimensional objects are useful during different stages of a design process. Three-dimensional representations of a model are commonly used to visualize a model in a physical context because a design engineer can manipulate the model in 3D space and can visualize the model from any conceivable viewpoint. Two-dimensional representations of a model are commonly used to prepare and formally document the design of a model.

A design engineer is a typical user of a 3D CAD system. The design engineer designs physical and aesthetic aspects of 3D models, and is skilled in 3D modeling techniques. The design engineer creates parts and may assemble the parts into a subassembly. A subassembly may also consist of other subassemblies. An assembly is designed using parts and subassemblies. Parts and subassemblies are hereinafter collectively referred to as components.

Parts, subassemblies, and assemblies can be quite complicated. A model that contains 10,000 parts is not uncommon. CAD models of agricultural vehicles, recreational vehicles, and some printer devices may likely have more than 10,000 parts. Some design engineers may wait up to thirty minutes for a CAD system to open a model and up to one minute for the completion of a basic operation, such as dragging a part on the computer screen from one location to another, highlighting a part, or mating two components. The more complex a model is (e.g., the greater the number of parts), the greater the load on the CAD system. The length of time taken to generate a component is a function of a number of factors, including the configuration of the computer system on which the modeling application runs. The amount of memory and the speed of the hardware processors installed on the computer system affect the performance of the modeling application. Additionally, the level of detail of the component being generated and the functionality that can be supported by the component influence the performance of the modeling application because both affect the amount of data that is stored, loaded, and processed.

To increase performance, current state-of-the-art systems may not load all the details of a model, may limit supported functionality, may add more memory, may enhance processor performance, or may increase performance by a combination thereof. For example, many design engineers use powerful mainframe computers to attain acceptable performance from a CAD system.

Also affecting performance is the necessity of updating all or a significant portion of a model anytime a modification is made to any supporting data structure of that model. Some modeling applications simply regenerate all data structures after any modification is made to the model. However, many state-of-the-art modeling applications do keep track of related data structures so that when a data structure is modified the modeling application can then locate related data structures and modify those data structures if necessary. Thus, for example, when a data structure is modified, a related data structure can be analyzed or operated upon to ensure that the related data structure is updated if needed.

Modeling applications, in general, do not have a standard or uniform storage scheme for keeping track of related data structures. Furthermore, tracking information may often be dispersed throughout a CAD modeling application. The lack of a standard storage scheme for tracking data may affect performance. For example, locating and gathering tracking information may be time-consuming when different procedures need to be invoked to retrieve data initially stored in various ways.

Time-saving advantages can be obtained by balancing memory usage, file loading time, level of detail of the design information, and a range of supported operations. However, utilizing an automated technique that provides an efficient means of updating a three-dimensional model by balancing various attributes of a computerized modeling system can enhance state of the art CAD systems.

SUMMARY OF THE INVENTION

In general, in one aspect, the invention features a computer-implemented method for creating a reference to data used to construct a computer-aided design model. The method stores model data with tracking data. The tracking data identifies the model data. A reference is created and the tracking data is associated with the reference, thereby enabling the reference to refer to the model data. A modeling operation is executed, which retrieves the tracking data associated with the reference, traverses a data structure defining the computer-aided design model while attempting to match the tracking data associated with the reference to the tracking data stored with the model data. Additionally, the modeling operation returns geometric data stored in the model data.

Implementations may include the geometric data defining a point, a line, or a surface. Implementations may also include topological and geometric entities being included with the model data, and one of the topological entities being identified by the tracking data stored with the model data. Moreover, implementations may include an association between the geometric data returned by the modeling operation and a topological entity identified by the tracking data.

Some implementations may also include receiving input that is graphical data, using the graphical data to determine which topological entity corresponds to the graphical data, and locating the tracking data stored with the model data by detecting an association between the topological entity and the tracking data stored with the model data.

Additionally, data describing an assembly context in which the model data exists can be collected and associated with the reference. Furthermore, the modeling operation can read the data describing the assembly context and traverse a data structure defining the computer-aided design model to determine the assembly context in which the model data exists, using that data.

Methods segregate the model data and the tracking data in a separate storage stream from other data used to construct the computer-aided design model. The reference can aid in the definition of a relationship between two or more entities of the computer-aided design model, and the relationship is one of a dimensional relationship and a mating relationship.

Moreover, implements include the model data being solid body data, sheet body data, or surface body data, the computer-aided design model being a solid model, and the model data being two-dimensional data, three-dimensional data, or both.

The details of one or more embodiments of the invention are set forth in the accompanying drawings and the description that follows. Other features, objects, and advantages of the invention will be apparent from the description and drawings, and from the claims.

DETAILED DESCRIPTION OF THE INVENTION

The present invention provides for efficient updates of a three-dimensional solid model by enabling the least amount of data to be loaded for the greatest number of operations that are performed on the 3D model. A wide range of computer-based operations may be performed on the 3D model without loading or re-generating all of the detailed model information. To accomplish this, the present invention creates a 3D model that uniquely balances several demanding CAD system requirements, including memory usage, file loading time, level of detail of design information, and range of supported operations. Hereinafter, such a 3D model created by the present invention shall be referred to as a lightweight model. The lightweight model described herein supports all geometry-based and layout operations, including, by way of non-limiting example, mating components, modifying visual parameters, creating measurements, and constructing features such as drafts and extrusions.

Figure 1:
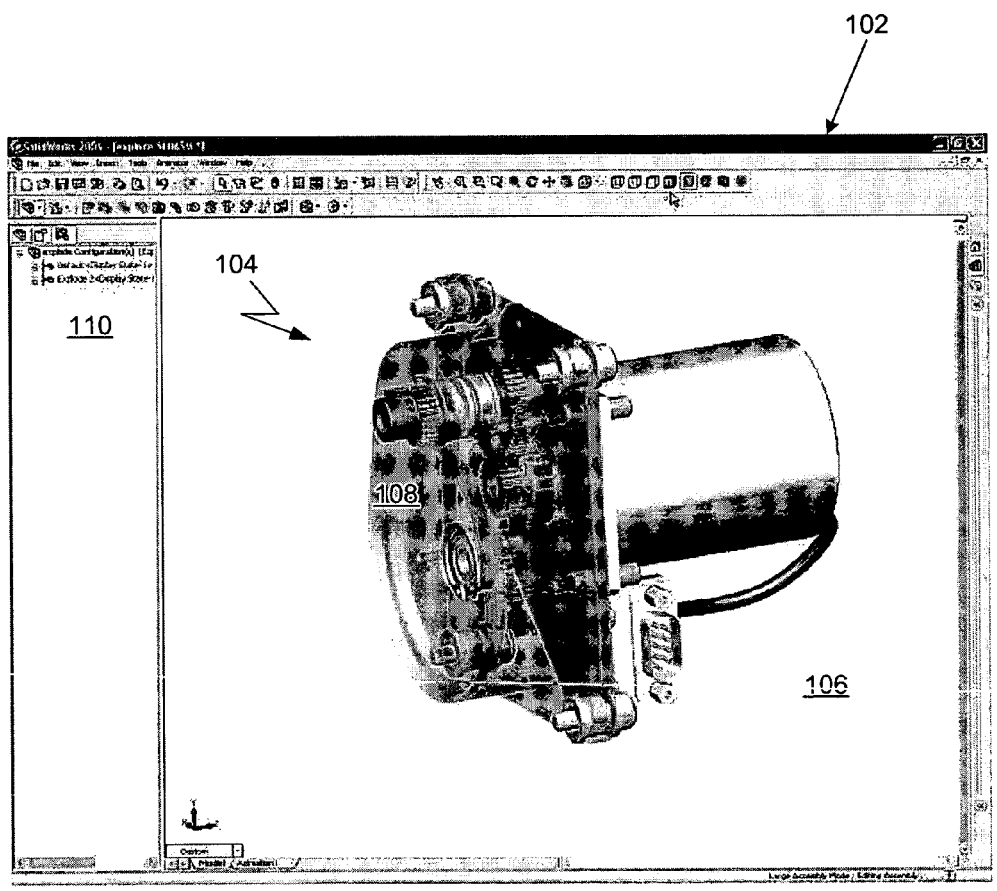
FIG. 1 is an illustration of a computer-generated model displayed in a window.

Referring now to FIG. 1, a window 102 displayed on a computer monitor is shown. The window 102 is generated by modeling software executed by a computerized modeling system, an example of which is later shown with reference to FIG. 8. The window 102 is a conventional computer-generated window that can be programmed by one of ordinary skill in the art using conventional, commercially available, software programming tools, such as those available from Microsoft Corporation of Redmond, Wash.

A computer-generated 3D model 104 is displayed within a modeling portion 106 of the window 102. The surfaces of the 3D model 104 can be displayed, or the 3D model 104 can be displayed using solid lines and dashed lines to show visible edges and hidden edges, respectively, of the 3D model. Moreover, surfaces can be transparent to reveal model components beneath such surfaces. (See, for example, the transparent surfaces of the gear housing 108 in FIG. 1.) Implementations also may include other window areas, such as a FeatureManager® window panel 110 in which the structure of a component, an assembly, or a drawing is listed to help the design engineer visualize and manipulate the 3D model 104, as well as components of the 3D model 104.

Figure 2:
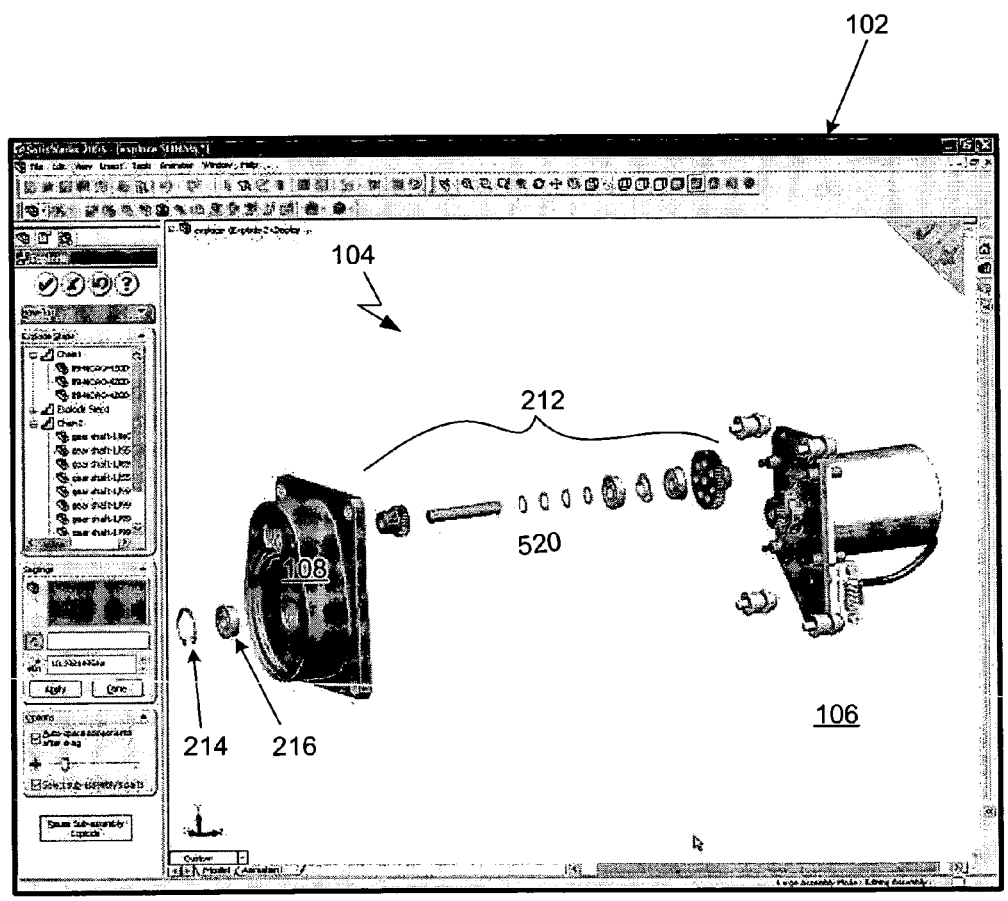
FIG. 2 is an illustration of a computer-generated model displayed in a window.

Referring to FIG. 2, an exploded view of the 3D model 104 is shown. The components of the gear subassembly 212 (e.g., the gears, shaft, washers, bearings, and spacer parts), are spread apart to clearly illustrate how the gear subassembly 212 is assembled. Other components of the 3D model 104 that are shown in the exploded view are the gear housing 108, snap ring 214, and bearing 216.

Computerized modeling systems may define components in a variety of ways. For example, a computerized modeling system may define each part in a separate file. Known by those of ordinary skill in the art, a part file can be defined as a storage structure (which may also be referred to as a container). Within the storage structure, one or more storage streams can be contained. One storage stream may define primitive data structures; another storage stream may define various features and the feature history; yet another storage stream may contain a display list, graphic elements, or both that are used to create an image of the part on a computer monitor. The contents of these storage streams may vary from one CAD application to another CAD application, and from implementation to implementation.

The present invention introduces another storage stream, hereinafter referred to as a tracked body stream. A tracked body stream includes solid body and tracking information in one data structure, and thereby, enables a design engineer to create, modify, and reference geometry in a lightweight model while all associated data is maintained. For example, a design engineer can create a hole feature and define the center of the hole to align with an edge in another part. The hole feature together with the remaining features of the part in which the hole feature belongs are constructed as a lightweight model. Thus, when the other part changes, the hole feature contains all information that is necessary to align the hole once more with the edge. That is, only the solid body data related to the hole feature need be accessed and possibly regenerated when the other part changes. Moreover, in an embodiment described herein, only a geometric entity within the solid body may need to be accessed and possibly regenerated.

Figure 3:
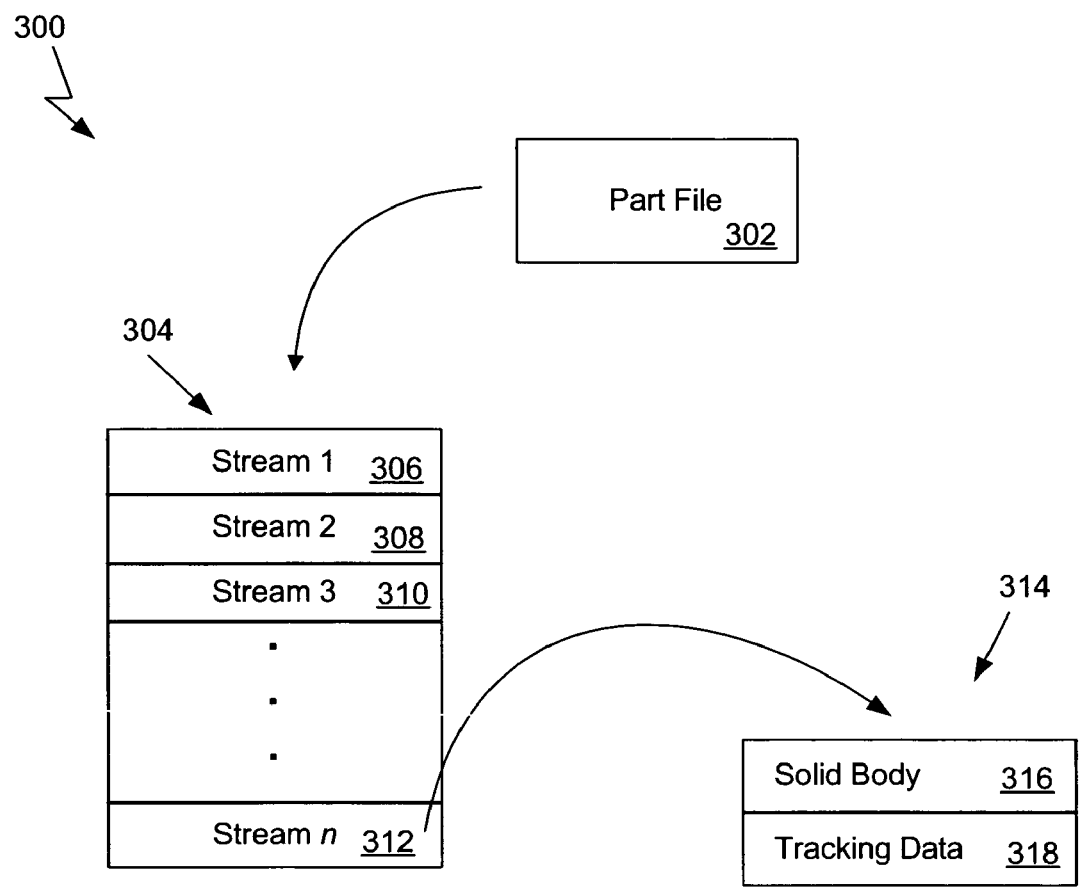
FIG. 3 is an illustration of a conceptual representation of a data structure.

FIG. 3 shows a conceptual representation of a data structure 300 that defines a part. The part file 302 can be a storage construct 304. The storage construct 304 can contain several storage streams (306-312). One such storage stream 312 is a tracked body stream and shown in more detail as a storage structure 314, which contains a solid body 316 and tracking data 318. The storage structure 314 in the part file 302 enables the solid body 316 and tracking data 318 to be saved and loaded together. Furthermore, the tracked body stream enables a modeling application to segregate a solid body and thereby avoid loading and accessing all the data associated with a 3D solid model each time an operation is performed.

A solid body consists of topological data and geometric data. The topological data in a solid body has corresponding geometric data in the same solid body. Each vertex corresponds to a point; each edge corresponds to a curve; each face corresponds to a surface. The tracking data 318 provides a uniform means by which the modeling system tracks the solid body 316 and links the topological data and geometric data belonging to the solid body 316 to an historical context in which an entity is created. One purpose the tracking data serves is to create and modify entities when one member of a relationship is modified.

Figure 4:
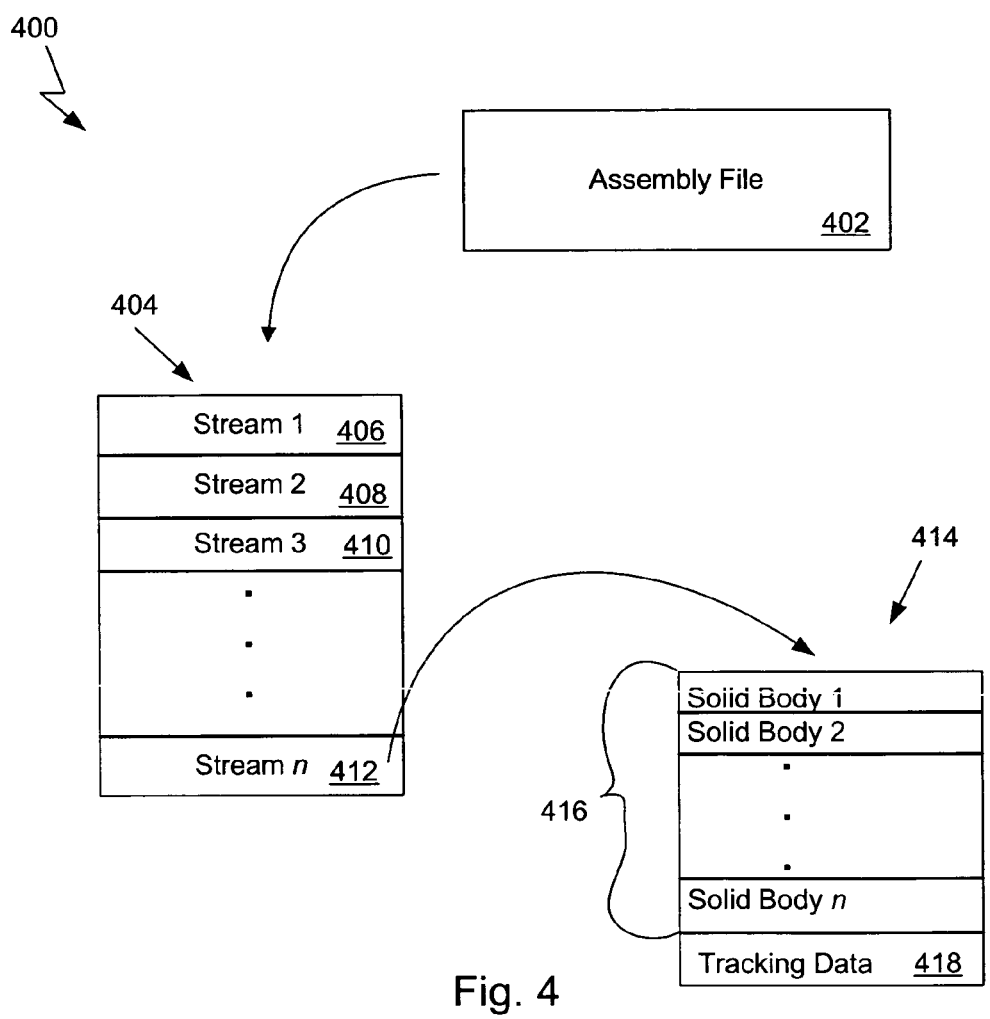
FIG. 4 is an illustration of a conceptual representation of a data structure.

Referring now to FIG. 4, a conceptual representation of a data structure 400 is shown and illustrates a file that defines an assembly file 402. Similar to the storage structure of a part file, assembly files store solid bodies and tracking data to a separate storage stream as well. An assembly file 402 can be a storage construct 404 that contains several storage streams (406-412). One of these storage streams 412 can be a storage construct 414 that contains several solid bodies 416 in addition to assembly level tracking data 418. Solid bodies of various parts may be subsumed into the assembly file and assembly level features may also be represented in the assembly file. Certain extrusions such as through holes (which have infinite depth), revolve features, and belt features are non-limiting example of assembly level features.

A lightweight model may not support certain functionality that a non-lightweight model supports. Trade-offs can be made to exclude (unless specifically required) the support for functionality that taxes the modeling system most heavily. For example, an embodiment may not support feature information queries if only a few part, assembly, and drawing operations implemented in the computerized modeling system are feature based. The composition of the storage streams in an embodiment determines what functionality will be supported. An embodiment described herein segregates a solid body and tracking data from other data in a part file or assembly file because a significant increase in performance may be realized by isolating the solid bodies from the other data that causes the heaviest load on the computerized modeling system. A lightweight model conceptually illustrated with reference to FIG. 3 and FIG. 4 supplies precise geometry information, full geometry entity tracking capability, and full component reference ability because the hierarchical structure of the assembly is also accessible.

Generally, empirical methods should be employed to determine which model data is essential for executing the most commonly performed operations. For example, if ninety percent of the data stored in a model's part files is required by ten percent of the operations most commonly executed and ten percent of the data in a model's part files is needed for ninety percent of the operations most commonly executed in a typical modeling session, then only that ten percent of the data most often required should be isolated in a lightweight model's tracked body stream.

Certain modeling commands create a relationship between entities that may require updating when one entity in the relationship is modified in some way. For example, a dimension is a relationship between entities and the value of the dimension needs to be updated if one entity changes location. A computerized modeling system may construct a dimension using a data structure that stores a reference to each one of the entities in the relationship together with data specifying a value for the dimension. A mating relationship is another example of a relationship between entities, such as a concentric relationship between a washer and a bolt. Whenever the bolt is relocated, the washer also is relocated to maintain the constraint created by the mating relationship.

Figure 5:
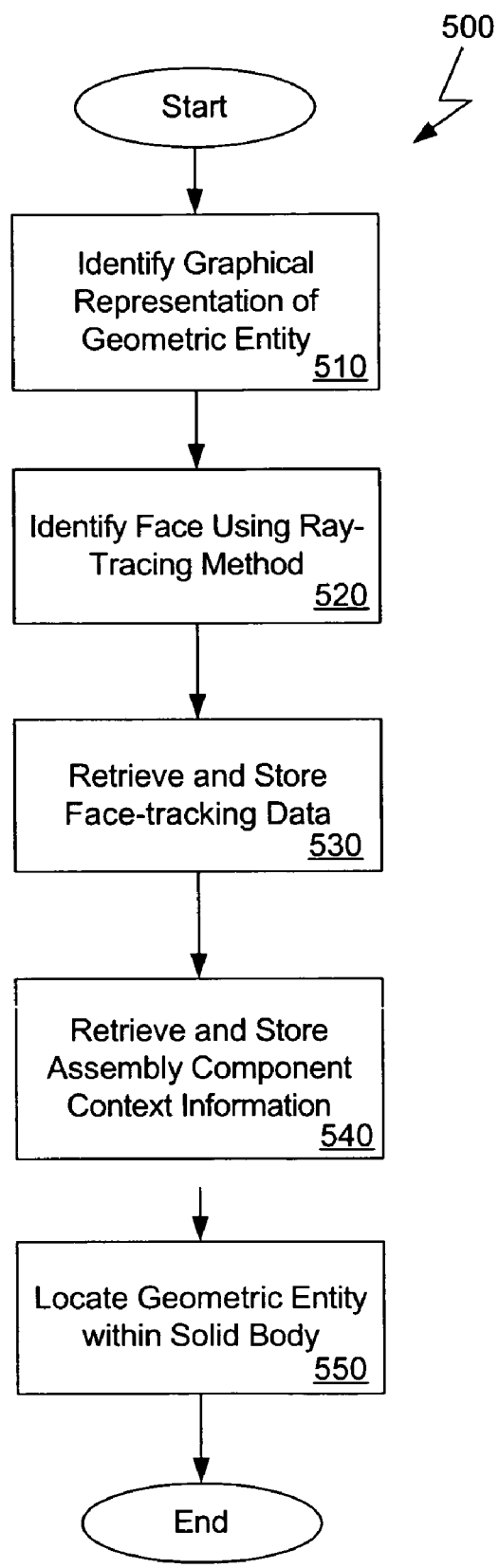
FIG. 5 is an illustration of a procedure that constructs a reference.

FIG. 5 illustrates a procedure 500 that constructs a reference using tracking data to include in a construct that defines a relationship. Procedure 500 begins by identifying a graphical representation of a geometric entity (step 510). The graphical representation may have been selected to specify an object that will form a relationship with one or more other objects. The face associated with the graphical representation is then identified by using a ray-tracing method (step 520), whereby rays emanate from a location (such as a point or a plane), corresponding to the identified graphical representation and the ray-tracing method determines the first topological entity (e.g., a face) with which a ray intersects in a specified direction. In the next step, face tracking data that is associated with the face in the solid body at the time the face is initially created is retrieved and stored in the reference (step 530). The assembly component context information (such as, by way of non-limiting example, the hierarchical path to the root of the data structure defining the assembly) is then retrieved and also stored in the reference (step 540) if the context in which the solid modeling is being created is an assembly context rather then that of a part. Thus, the solid body and tracking information is associated with assembly context information in the reference.

Later during a design session, the reference may be accessed because, for example, the solid body to which the reference refers needs to be retrieved, analyzed, or updated. Moreover, the reference may also need to be updated. By way of non-limiting example, a reference may need updating to modify the value of a dimension if the location of an entity referenced by the dimension changed. The updated value of the dimension will be determined after analyzing one or more solid bodies to which the reference refers. Procedure 500 then will use the face tracking data and assembly context information in the reference as a key to locate a topological entity, a geometric entity, or both within a solid body (step 550), which is discussed in more detail with reference to FIG. 6.

Figure 6:
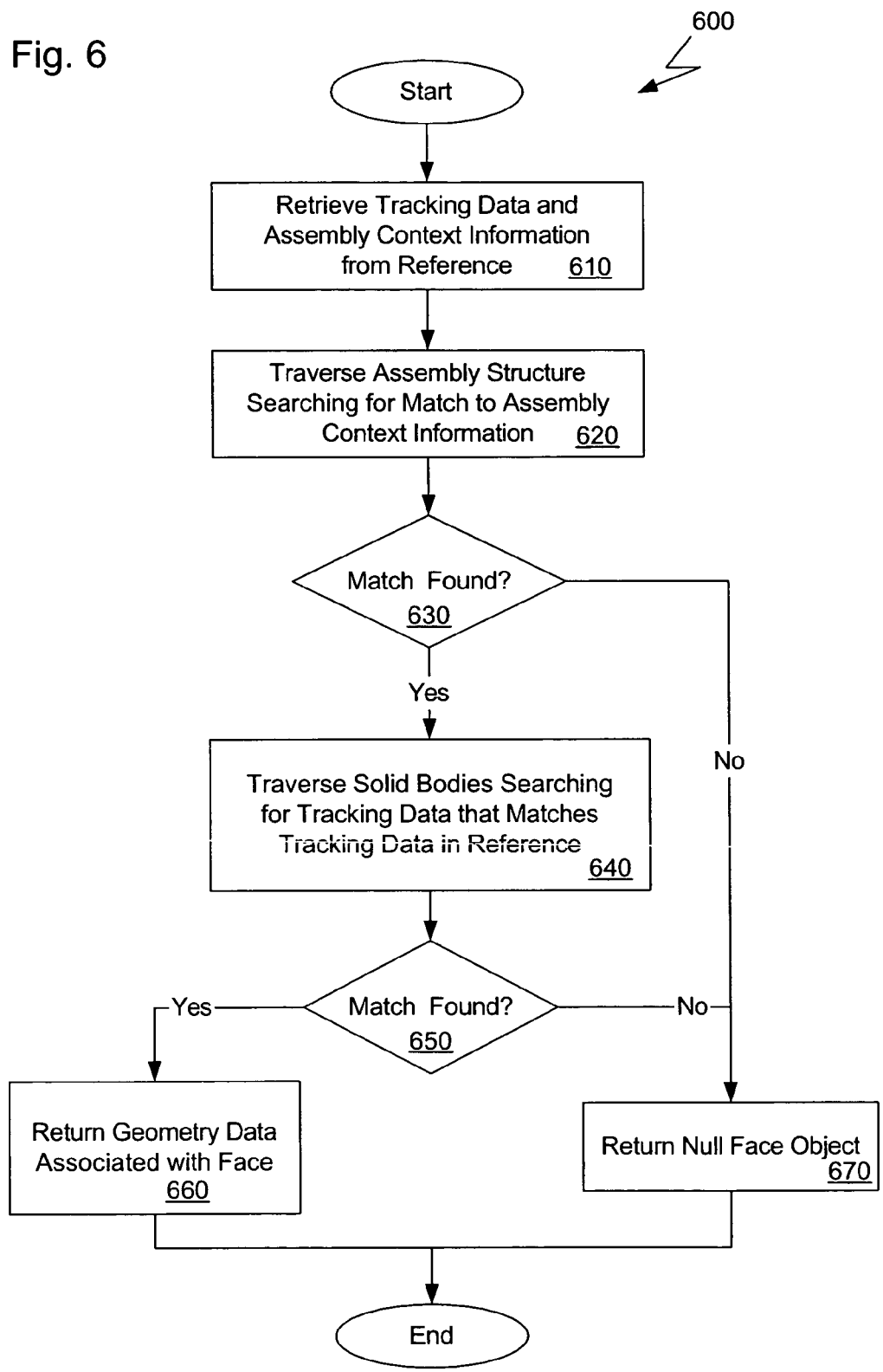
FIG. 6 is an illustration of a procedure that locates a geometric entity within a solid body.

Referring now to FIG. 6, a procedure 600 that locates a topological entity, a geometric entity, or both within a solid body is shown. In the first step, the tracking data and assembly context information is retrieved from the reference (step 610). The assembly structure is then traversed to establish the context in which the solid body, or at least an entity therein, was created. To establish the context, the assembly context information retrieved from the reference is matched with that in the assembly structure as the assembly structure is traversed (step 620). If a match is found (tested in step 630), one or more solid bodies created in the established context are traversed while searching for the face tracking data that matches the face tracking data in the reference (step 640). If a match is found (tested in step 650), the geometric data associated with the face that is identified by the face tracking data is returned to a calling procedure (step 660). By way of non-limiting example, the calling procedure may be used by an update operation. When a match is not found (tested in step 630 and step 650), a null face object is returned (step 670).

In one embodiment, tracking data is generated only for each face in a solid body and is a list of integers. The list of integers is a set of identifiers created when modeling operations construct face entities. Other embodiments may have unique tracking data for each topological entity (i.e., for each vertex, edge, and face in a solid body).

Figure 7:
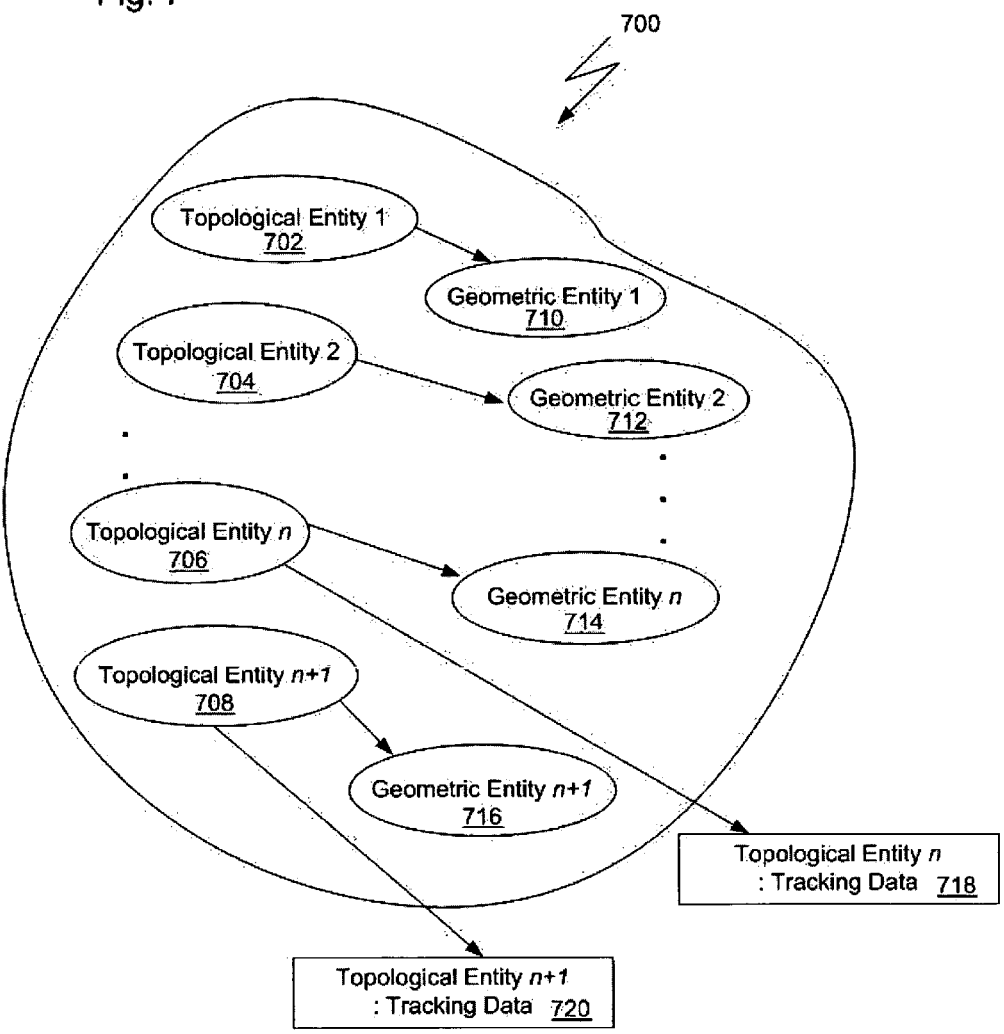
FIG. 7 is an illustration of a conceptual representation of a solid body.

FIG. 7 is a conceptual illustration of a solid body 700. Within the solid body 700 are a number of topological entities 702-708. The topological entities may be vertices, edges, or faces. Each topological entity 702-708 corresponds to a geometric entity 710-716. A topological entity that is a face, not only has a pointer to a corresponding geometric entity, but also has a pointer to the relevant tracking data. In FIG. 7, a face that is the nth topological entity 706 has a pointer to the nth geometric entity 714 that is the corresponding surface in the same solid body 700, and has a pointer to the corresponding tracking data 718 located outside the solid body 700. Likewise, topological entity n+1 708 has a pointer to the geometric entity n+1 716, and has a pointer to the corresponding tracking data 720. (An embodiment may also have tracking data associated with topological entities that are edges, vertices, or both.)

As discussed, the storage streams that are loaded depend upon the operation being performed. Thus, each operation includes internal logic that specifies what type of data is needed for the operation. To achieve the desired performance benefit, an implementation needs to balance the number of storage streams that will be created in general, and the number of storage streams and which of those storage streams will be loaded by various operations (since contents of one stream may have a greater affect on performance than the contents of another stream). The fewer the number of storage streams and the fewer storage streams that are loaded, the more simplified the management of the storage streams will be, and the greater the performance benefit realized.

In general, the present invention isolates data most commonly needed with tracking data in a separate storage stream. An implementation-specific embodiment of the present invention, which has been discussed herein, isolates one or more solid bodies with tracking data in a separate storage stream. The storage streams that are loaded depend on what data various operations need for support. This enables, by way of non-limiting example, assembly operations to be performed without loading all the data stored in a part file.

Figure 8:
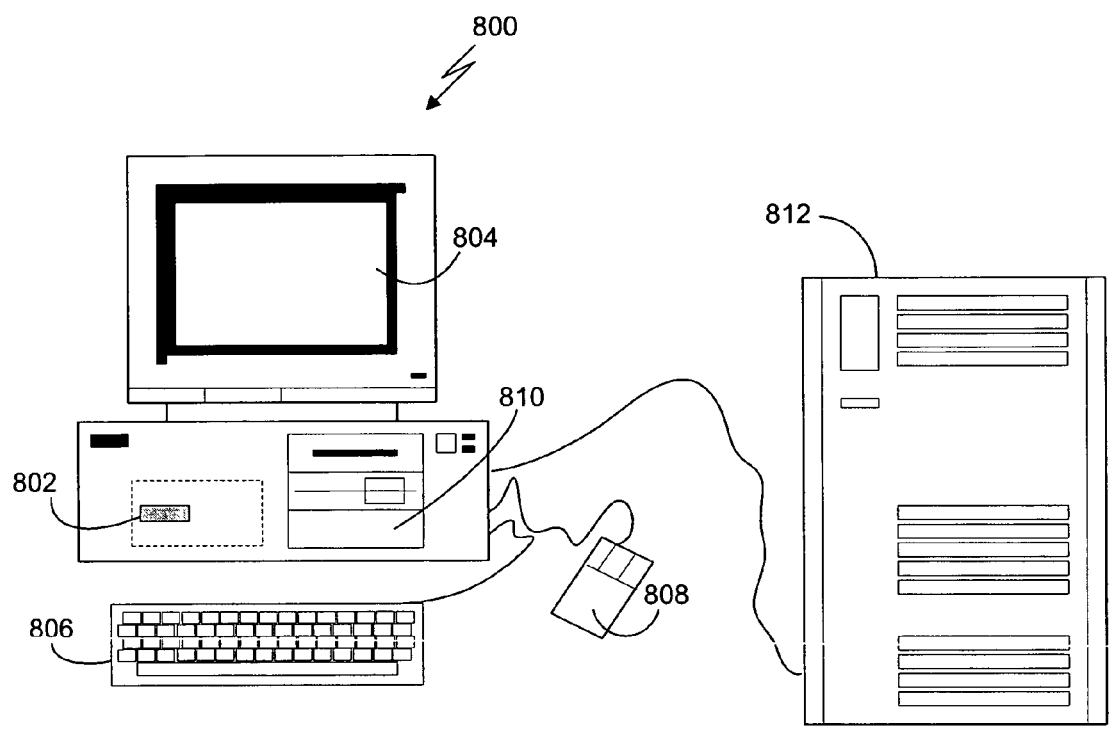
FIG. 8 is a diagram of a computer system.

Referring now to FIG. 8, a computerized modeling system 800 is shown and includes a CPU 802, a computer monitor 804, a keyboard input device 806, a mouse input device 808, and a storage device 810. The CPU 802, computer monitor 804, keyboard 806, mouse 808, and storage device 810 can include commonly available computer hardware devices. For example, the CPU 802 can include a Pentium-based processor. The mouse 808 may have conventional left and right buttons that the user may press to issue a command to a software program being executed by the CPU 802. As an alternative or in addition to the mouse 808, the computerized modeling system 800 can include a pointing device such as a trackball, touch-sensitive pad, or pointing device and buttons built into the keyboard 806. Those of ordinary skill in the art appreciate that the same results described herein with reference to a mouse device can be achieved using another available pointing device. Other appropriate computer hardware platforms are suitable as will become apparent from the discussion that follows. Such computer hardware platforms are preferably capable of operating the Microsoft Windows NT, Windows 98, Windows 2000, Windows XP, Windows ME, UNIX, Linux, or MAC OS operating systems.

Additional computer processing units and hardware devices (e.g., rapid prototyping, video, and printer devices) may be included in the computerized modeling system 800. Furthermore, the computerized modeling system 800 may include network hardware and software thereby enabling communication to a hardware platform 812, and facilitating communication between numerous computer systems that include a CPU and a storage system, among other computer components.

Computer-aided modeling software may be stored on the storage device 810 and loaded into and executed by the CPU 802. The modeling software allows a user to create and modify a 3D model and implements aspects of the invention described herein. The CPU 802 uses the computer monitor 804 to display a 3D model and other aspects thereof as described. Using the keyboard 806 and the mouse 808, the user can enter and modify data associated with the 3D model. The CPU 802 accepts and processes input from the keyboard 806 and mouse 808. The CPU 802 processes the input along with the data associated with the 3D model and makes corresponding and appropriate changes to that which is displayed on the computer monitor 804 as commanded by the modeling software. In one embodiment, the modeling software is based on a solid modeling system that may be used to construct a 3D model consisting of one or more solid and surface bodies.

The invention may be implemented in digital electronic circuitry, or in computer hardware, firmware, software, or in combinations thereof. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output. The invention may advantageously be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; in any case, the language may be a compiled or interpreted language. Suitable processors include, by way of non-limiting example, both general and special purpose microprocessors. Generally, a processor will receive instructions and data from a read-only memory and/or a random access memory. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, custom-designed ASICs (application-specific integrated circuits).

An advantage of the present invention is that all geometry operations are supported in the lightweight model; thus, a design engineer can create, modify, and reference any geometry. Three-dimensional solid body and entity tracking information are loaded with graphical tessellation information. All major drawing operations, such as hidden line removal calculations and dimensioning, are automatically supported since all geometric information is available. Furthermore, the present invention allows for the creation of engineering drawings using a lightweight model. Moreover, most operations, such as adding mates and cutting a hole, are geometry based. Hence, using the lightweight model, one can open a design quicker, use less memory, and still perform most operations.

Other advantages include the ability to load additional model information on demand, which is possible because the lightweight model is a subset of a full-weight model. Thus, switching between lightweight and full-weight model functionality as an application necessitates is seamless.

Yet another advantage is that lightweight models can boost performance without investing in more powerful computer hardware.

A number of embodiments of the present invention have been described. Nevertheless, it will be understood that various modifications may be made without departing from the spirit and scope of the invention. For example, implementations may change the order in which operations are performed. Furthermore, depending on the needs of an implementation, particular operations described herein may be implemented as a combined operation, eliminated, added to, or otherwise rearranged.

Additionally, although the embodiments described herein only refer to bodies that are solid bodies, the present invention can also be applied to other types of bodies, such as sheet bodies that may also be referred to as surface bodies.

Accordingly, other embodiments are within the scope of the following claims.

What is claimed is:

1. A computer-implemented method for creating a reference to data used to construct a computer-aided design model, the method comprising:
   from a subject computer-aided design model comprising model data, storing the model data with tracking data, wherein the tracking data identifies the model data;
   creating a reference, wherein the tracking data is associated with the reference to enable the reference to refer to the stored model data; and
   executing a modeling operation on the subject computer-aided design model, wherein the modeling operation is one of a geometry-based operation and a layout operation, and wherein executing comprises:
   retrieving the tracking data associated with the reference;
   traversing an assembly structure defining the computer-aided design model, the assembly structure configured to avoid loading all current model data each time a modeling operation is executed by loading portions of model data as a function of the modeling operation being executed and enabling a least amount of model data to be loaded for a greatest number of operations performed on the subject computer-aided design model, said traversing including attempting to match the retrieved tracking data associated with the reference to the tracking data stored with the model data;
   finding the tracking data stored with the model data; and
   returning geometric data stored in the model data.

2. The computer-implemented method of claim 1, wherein the geometric data defines one of a point, a line, or a surface.

3. The computer-implemented method of claim 1, wherein:
   the model data is comprised of a plurality of topological entities and a plurality of geometric entities; and
   the tracking data stored with the model data further identifies one of the plurality of topological entities.

4. The computer-implemented method of claim 3, wherein the geometric data returned has an association with the one of the plurality of topological entities identified.

5. The computer-implemented method of claim 3, wherein creating the reference comprises:
   receiving input comprised of graphical data;
   using the graphical data to determine one of the plurality of topological entities corresponding to the graphical data; and
   locating the tracking data stored with the model data by detecting an association between the one of the plurality of topological entities and the tracking data stored with the model data.

6. The computer-implemented method of claim 5, further comprising:
   collecting data describing an assembly context in which the model data exists; and
   associating the data describing the assembly context with the reference.

7. The computer-implemented method of claim 6, wherein executing the modeling operation further comprises:
   reading the data describing the assembly context; and
   traversing a data structure defining the computer-aided design model to determine the assembly context in which the model data exists, wherein the data describing the assembly context is used in determining the assembly context.

8. The computer-implemented method of claim 1, wherein the model data and the tracking data are segregated in a separate storage stream from a plurality of other data used to construct the computer-aided design model.

9. The computer-implemented method of claim 1, wherein the reference aids in the definition of a relationship between two or more entities of the computer-aided design model.

10. The computer-implemented method of claim 9, wherein the relationship is one of a dimensional relationship and a mating relationship.

11. The computer-implemented method of claim 1, wherein creating the reference comprises:
    creating a copy of the tracking data; and
    storing the copy of the tracking data in the reference to associate the tracking data with the reference.

12. The computer-implemented method of claim 1, wherein the model data is one of solid body data, sheet body data, and surface body data.

13. The computer-implemented method of claim 1, wherein the computer-aided design model is a solid model.

14. The computer-implemented method of claim 1, wherein the model data is comprised of at least one of two-dimensional data and three-dimensional data.

15. A computer-readable data storage medium comprising instructions for causing a computer to:
    segregate a body and tracking data from a plurality of other data used to describe a subject three-dimensional model;
    create a reference data structure describing a relationship that needs to be maintained in the subject three-dimensional model;
    store data for associating the tracking data with the reference data structure;
    perform a modeling operation on the subject three-dimensional model, wherein the modeling operation:
    is one of a geometry-based operation and a layout operation;
    reads the data for associating the tracking data with the reference data structure;
    locates the tracking data segregated with the body in a data structure by utilizing the data for associating the tracking data, wherein the data structure is: (a) comprised of a plurality of bodies used to describe the subject three-dimensional model, (b) designed to avoid loading all current data used to describe the subject three-dimensional model with each execution of modeling operations, and (c) designed to allow, as a function of the modeling operation being executed, loading of portions of the data used to describe the subject three-dimensional model and enabling a least amount of the data to be loaded for a greatest number of operations performed on the subject three-dimensional model;
    identifies a topological entity in the body by recognizing an association with the tracking data; and
    identifies a geometric entity associated with the topological entity.

16. The data storage medium of claim 15, further comprising instructions for causing the computer to:
    determine an assembly context in which the body is created;
    store data identifying the assembly context accessible to the reference data structure;

read the data identifying the assembly context while performing the modeling operation; find the assembly context identified by the data identifying the assembly context;
and conduct a search that locates the tracking data to the assembly context.

17. The data storage medium of claim 15, wherein the vehicle in which the body and tracking data is segregated is a storage stream.

18. The data storage medium of claim 15, wherein the modeling operation updates the reference.

19. The data storage medium of claim 15, wherein the modeling operation performs a geometry-based operation.

20. The data storage medium of claim 15, wherein the body is one of a solid body, a sheet body, and a surface body.

21. The data storage medium of claim 15, wherein the three-dimensional model is a solid model.

22. A computer-aided design system comprising:
a processor operatively coupled to a data storage system, the data storage system storing a subject model; and
a data storage memory operatively coupled to the processor and comprising instructions to configure the processor to:
construct a plurality of model objects used to define the subject model;
generate a plurality of identifying data wherein each one of the identifying data identifies an entity in a corresponding one of the plurality of model objects;
store in an isolated data structure at least one of the plurality of model objects and the identifying data that identifies the entity in the corresponding one of the plurality of model objects stored in the isolated data structure, wherein the isolated data structure is: (a) accessible independently of all other data defining the subject model, (b) designed to avoid loading all current data used to define the subject model with each execution of modeling operations, and (c) designed to allow, as a function of modeling operation being executed, loading of portions of the data used to define the subject model and enabling a least amount of the data to be loaded for a greatest number of operations performed on the subject model, wherein the modeling operations are any of a geometry-based operation and a layout operation;
create a reference data structure, wherein the reference data structure is comprised of data associating one of the identifying data with the corresponding one of the plurality of model objects to afford swift access to the corresponding entity in the model object.

23. The computer-aided design system of claim 22, wherein the entity identified by the identifying data is one of a topological entity and a geometric entity.

24. The computer-aided design system of claim 22, further comprising instructions to configure the processor to:
execute a command requiring maintenance of a relationship established in the model, wherein the reference data structure defines the relationship;
read the data associating one of the identifying data;
search an assembly data structure using the data associating one of the identifying data to find the identifying data until the identifying data is found; and
access the entity for use in maintaining the relationship.

25. The computer-aided design system of claim 24, wherein the relationship is one of a mating relationship and a dimension.

26. The computer-aided design system of claim 24, wherein:
the entity identified by the identifying data is a topological entity;
the topological entity has a corresponding geometric entity; and
the corresponding geometrical entity is retrieved for further processing to maintain the relationship.

27. The computer-aided design system of claim 22, further comprising instructions to configure the processor to modify the reference data structure.

28. The computer-aided design system of claim 22, further comprising instructions to configure the processor to:
determine a context in which the corresponding one of the plurality of model objects exists within the model;
generate a context identifier that identifies the context; and
include the context identifier in the reference data structure.

29. The computer-aided design system of claim 22, wherein each one of the plurality of model objects is a body having a type chosen from the group consisting of a solid body, a sheet body and a surface body.

30. The computer-aided design system of claim 22, wherein the plurality of model objects is comprised of at least one of two-dimensional objects and three-dimensional objects.

* * * * *